(12) United States Patent
Rolland

(10) Patent No.: US 11,563,282 B2
(45) Date of Patent: Jan. 24, 2023

(54) TERMINAL BLOCK HOUSING INTENDED TO RECEIVE AT LEAST ONE MULTI-STRAND CABLE

(71) Applicant: SAGEMCOM ENERGY & TELECOM SAS, Rueil Malmaison (FR)

(72) Inventor: Patrick Rolland, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 17/616,915

(22) PCT Filed: May 19, 2020

(86) PCT No.: PCT/EP2020/063998
§ 371 (c)(1),
(2) Date: Dec. 6, 2021

(87) PCT Pub. No.: WO2021/013404
PCT Pub. Date: Jan. 28, 2021

(65) Prior Publication Data
US 2022/0271450 A1     Aug. 25, 2022

(30) Foreign Application Priority Data
Jul. 24, 2019   (FR) ...................................... 1908406

(51) Int. Cl.
*H01R 9/24*       (2006.01)
*G01R 1/04*       (2006.01)

(52) U.S. Cl.
CPC .............. *H01R 9/24* (2013.01); *G01R 1/0416* (2013.01)

(58) Field of Classification Search
CPC .......... H01R 9/22; H01R 9/24; H01R 9/2416; G01R 1/00; G01R 1/02; G01R 1/04; G01R 1/0408; G01R 1/0416
See application file for complete search history.

(56) References Cited

U.S. PATENT DOCUMENTS 7,780,467 B2 * 8/2010 Daily ................... H01R 4/4818
                                                           439/440
7,845,980 B1    12/2010 Amidon
(Continued)

FOREIGN PATENT DOCUMENTS

KR         20190019458 A      2/2019

*Primary Examiner* — Huy Q Phan
*Assistant Examiner* — David B Frederiksen
(74) *Attorney, Agent, or Firm* — Muncy, Geissler, Olds & Lowe, P.C.

(57) ABSTRACT

The invention relates to a housing comprising a terminal block intended to receive at least one end of a multi-strand cable and therefore comprising at least one recess (6a, 6b, 6c, 6d) for receiving the end of the cable, the recess being provided with a wall (8) in which an opening (7a, 7b, 7c, 7d) is arranged and through which the end of the cable extends during use, and a flank (10a, 10b, 10c, 10d) arranged opposite the wall with the opening, at least one surface of the flank facing the inside of the recess being rough in order to limit the risk of at least one strand detached from the end of the cable sliding through a space between the flank and the rest of the housing.

13 Claims, 3 Drawing Sheets

(56) References Cited

U.S. PATENT DOCUMENTS

| | | | | |
|---|---|---|---|---|
| 8,485,830 B1* | 7/2013 | Tsai | ............ | H01R 13/501 |
| | | | | 439/56 |
| 2010/0203775 A1* | 8/2010 | Howard | ............ | H01R 4/36 |
| | | | | 439/801 |
| 2013/0267130 A1* | 10/2013 | Sommer | ............ | H01R 9/24 |
| | | | | 439/810 |
| 2014/0262709 A1* | 9/2014 | Helms | ............ | H01H 1/06 |
| | | | | 200/279 |

* cited by examiner

TERMINAL BLOCK HOUSING INTENDED TO RECEIVE AT LEAST ONE MULTI-STRAND CABLE

The invention relates to a unit including a terminal block for receiving at least one multistrand wire.

BACKGROUND OF THE INVENTION

When electricity meters are being installed, multistrand wires need to be connected to the terminal block of the meter.

For this purpose, an operator strips each wire over several millimeters (mm), usually 17 mm, prior to inserting the wire into the terminal block.

Conventionally the wires are either 7-strand wires or else multistrand wires having strands of very small diameter (about 320 strands). With multistrand wires, once the end of the wire has been stripped, it can happen that some strands become separated from the wire. The strands have a diameter of about one tenth of a millimeter, and they can thus easily slip into gaps.

With a "bottom-entry" meter, the terminal block is at the bottom end of the meter. Under such circumstances, the strands cannot penetrate into the inside of the meter, since gravity keeps them confined within the terminal block.

In contrast, with a "top-entry" meter, the terminal block is at the top end of the meter. This means that gravity can thus cause strands to penetrate into the inside of the meter via gaps between the terminal block and the remainder of the electricity meter, and so the strands can reach sensitive zones, such as electronic circuit cards. This can lead to a short-circuit while the electricity meter is in use.

Unfortunately, this intrusion of strands takes place without the operator being aware of it because of the small diameter of the strands and because it is not possible to view this portion of the meter: the operator therefore cannot take action to prevent such an accident.

In order to avoid that problem, proposals have been made to have recourse to a system of baffles secured to the base and/or the cover of the meter.

Unfortunately, such a solution is voluminous and the surroundings of the meter do not always leave room for baffles to be installed.

OBJECT OF THE INVENTION

An object of the invention is to propose a unit that limits the risk of penetration by metal strands from the stripped end of a wire that is to be connected to the unit.

SUMMARY OF THE INVENTION

In order to achieve this object, the invention provides a unit including a terminal block for receiving at least one end of a multistrand wire and comprising for this purpose at least one housing for receiving the end of the wire, the housing being provided both with a wall having an opening made therein through which the end of the wire extends in service and also with a flank arranged opposite from the wall that includes the opening, at least one face of the flank facing towards the inside of the housing being provided with asperities in order to limit any risk of a strand detached from the end of the wire sliding through space between the flank and the remainder of the unit.

As a result, appropriately adding a flank of non-smooth texture to the bottom of the unit serves to limit any risk of a strand penetrating into the inside of the remainder of the unit and reaching sensitive zones, such as, for example and in nonlimiting manner, one or more electronic circuit cards arranged inside the unit.

In particular, the non-smooth texture of the flank limits movement of detached strands inside the housing and thus limits any risk of the strands reaching a gap between the housing and the remainder of the unit.

The invention is also found to be both simple to implement and also compact. In particular, with the invention there is no need to have recourse to the voluminous baffles of the prior art.

Naturally, in the present application, the terms "top" and "bottom" should be understood relative to the in-service position of the unit when it is mounted on a support. The terms "right", "left", "front", and "back" likewise relate to the in-service position of the unit when it is mounted on a support and when looking at its front, with the support behind the unit.

Optionally, asperities of the face are formed at least by serrations.

Optionally, the serrations are juxtaposed without space between two consecutive serrations.

Optionally, the serrations on a given face are all identical.

Optionally, at least one of the serrations is triangular in section.

Optionally, at least one serration presents a sharp top.

Optionally, at least one of the serrations has a height of not less than 1 mm.

Optionally, asperities of the face are formed at least by roughening the face.

Optionally, the roughening is such that it forms cracks having a depth lying in the range 3 to 5 hundredths of a millimeter in the associated face.

Optionally, the unit includes at least one tongue arranged in the space between the flank and the remainder of the unit, at least one face of the tongue being provided with asperities.

Optionally, asperities of the face are formed at least by serrations.

Optionally, asperities of the face are formed at least by roughening said face.

Optionally, the unit is an electricity meter.

Other characteristics and advantages of the invention appear on reading the following description of a particular, nonlimiting implementation of the invention.

BRIEF DESCRIPTION OF THE DRAWINGS

The invention can be better understood in the light of the following description given with reference to the accompanying figures, in which.

DETAILED DESCRIPTION OF THE INVENTION

Figure 1:
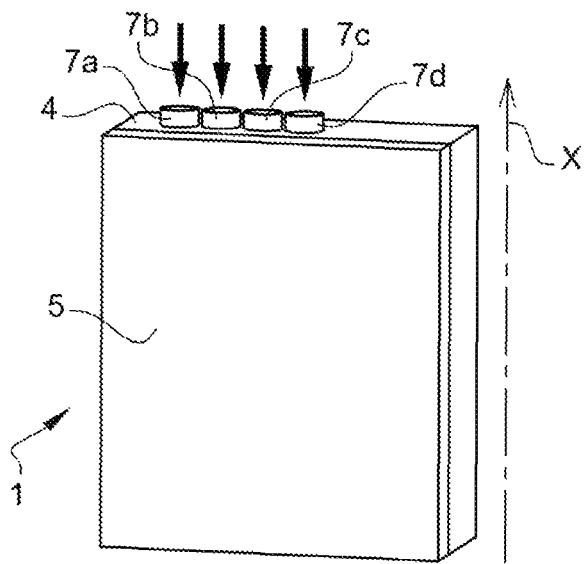
FIG. 1 is a perspective view of a bottom-entry electricity meter in a particular embodiment of the invention.
Figure 2:
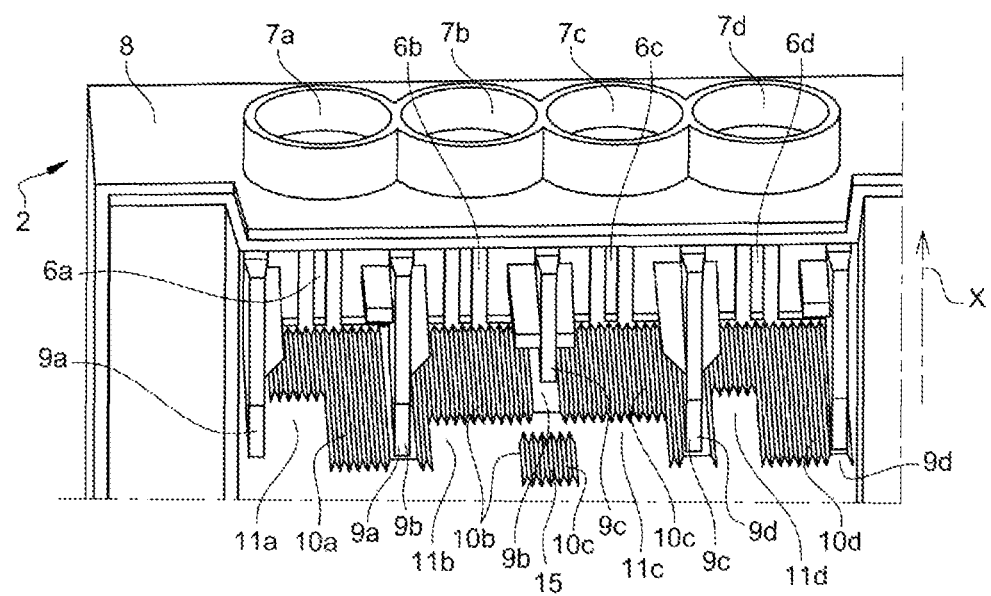
FIG. 2 is a perspective view of a top portion of a base of the electricity meter shown in FIG. 1.

With reference to FIGS. 1 to 4, in this example a unit in a particular embodiment of the invention is a top-entry electricity meter, given overall reference 1.

The unit comprises a base 2 and a cover 3 together forming a unit body. The base 2 is the portion of the unit 1 that is to be arranged against a support, such as a wall, in order to mount the unit 1. The cover 3 is the portion of the unit 1 that is fitted on the base 2 once it is in position on the support in order to close the unit 1.

Because the electricity meter is a top-entry meter, the unit 1 includes a terminal block 4 arranged in its top portion, with the terminal block 4 in this example being defined by cooperation between the base 2 and the cover 3. The terminal block 4 forms the connection zone of the unit 1, with the remainder of the unit 1 forming a functional enclosure 5 of the unit 1 that contains sensitive elements of the unit 1, e.g. such as one or more electronic circuit cards.

The terminal block 4 presents at least one housing for receiving the end of a multistrand wire, which end is stripped over at least a portion of its length.

The end of the wire is typically stripped over 17 mm. By way of example, the multistrand wire is a wire having about 320 strands. Each strand has a diameter of about 0.1 mm. In this example, each strand is made of copper.

In a particular embodiment, the terminal block 4 has four housings 6a, 6b, 6c, and 6d, each suitable for receiving the stripped end of a respective multistrand wire.

In this example, the four housings 6a, 6b, 6c, and 6d extend parallel to one another and to a common axis X. When the unit 1 is in position on a support, the axis X extends substantially vertically.

The four housings 6a, 6b, 6c, and 6d are also juxtaposed.

In particular, each housing includes a respective opening 7a, 7b, 7c, or 7d through which the end of the associated wire is inserted. Preferably, all of the various openings 7a, 7b, 7c, and 7d are arranged in the same one of the lateral walls 8 of the unit 1. In this example, said lateral wall 8 forms part of the base 2 and it is arranged in such a manner as to form a top face of the unit 1.

As a result, the openings 7a, 7b, 7c, and 7d are present in the top face of the unit 1 and the wires can be inserted substantially vertically through said face into the housings 6a, 6b, 6c, and 6d as represented by arrows in FIG. 1.

In this example, the meter is a single-phase meter.

Under such circumstances, a first housing 6a (corresponding to the end housing on the left) is for receiving a wire corresponding to one phase, the second housing 6b (corresponding to the housing next to the first housing) is for receiving a wire corresponding to neutral, the third housing 6c (corresponding to the housing next to the second housing) is for receiving a wire corresponding to neutral, and the fourth housing 6d (corresponding to the housing next to the third housing and also constituting the end housing on the right) is for receiving a wire corresponding to one phase. The second housing 6b and the third housing 6c are also referred to jointly as the "central" housings. The first housing 6a and the second housing 6b are used for connecting to the electricity network, while the third housing 6c and the fourth housing 6d are used for connecting to a user's home.

As mentioned above, the terms "left" and "right" should be understood for the unit 1 in its in-service position, i.e. with the base 2 against a support, and with the openings 7a, 7b, 7c, and 7d then being in the top face of the unit 1.

Each housing 6a, 6b, 6c, and 6d is defined by the base 2 and by the cover 3 respectively forming the back and the front of the housings 6a, 6b, 6c, and 6d, and is also defined by the lateral wall 8 in which the openings 7a, 7b, 7c, and 7d are arranged, forming the tops of the housings 6a, 6b, 6c, and 6d. Furthermore, each housing 6a, 6b, 6c, and 6d is also defined by three flanks that extend from the base 2 towards the cover 3, substantially perpendicularly to the base 2:

- two flanks 9a, 9b, 9c, and 9d forming the sides of the housing and extending substantially perpendicularly to the lateral wall 8; and
- one flank 10a, 10b, 10c, and 10d forming a bottom for the housing 6a, 6b, 6c, and 6d and extending facing the openings 7a, 7b, 7c, and 7d, substantially parallel to the lateral wall 8, each said flank being referred to below as an "insulating" flank.

It should be observed that a flank 9a, 9b, 9c or 9d forming a side of one of the housings 6a, 6b, 6c, or 6d may be common to two adjacent housings.

Figure 3:
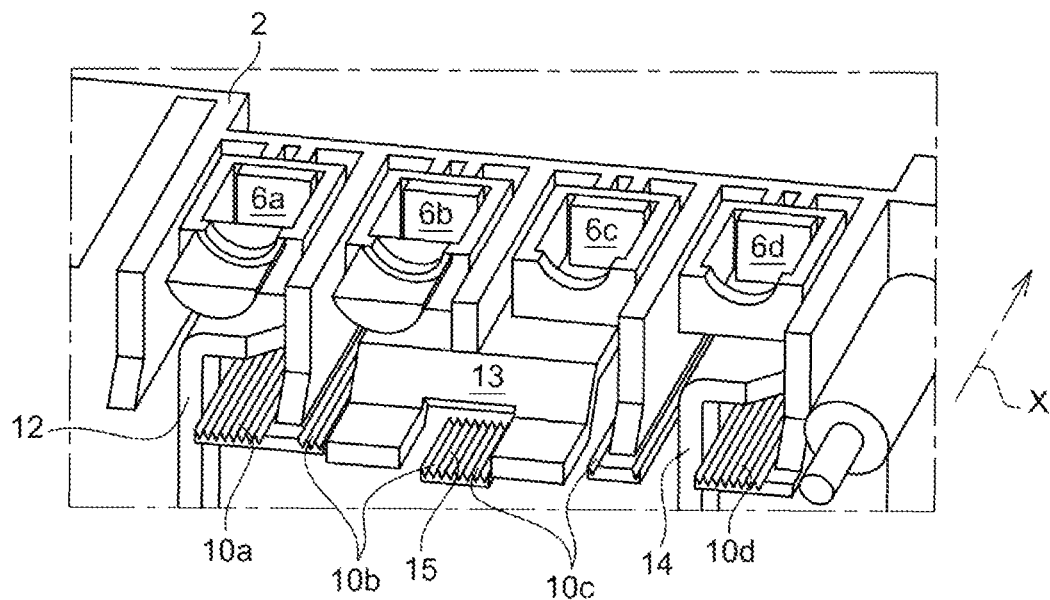
FIG. 3 is a fragmentary section view of a top portion of the electricity meter shown in FIG. 1, the cover of the meter not being shown.
Figure 4:
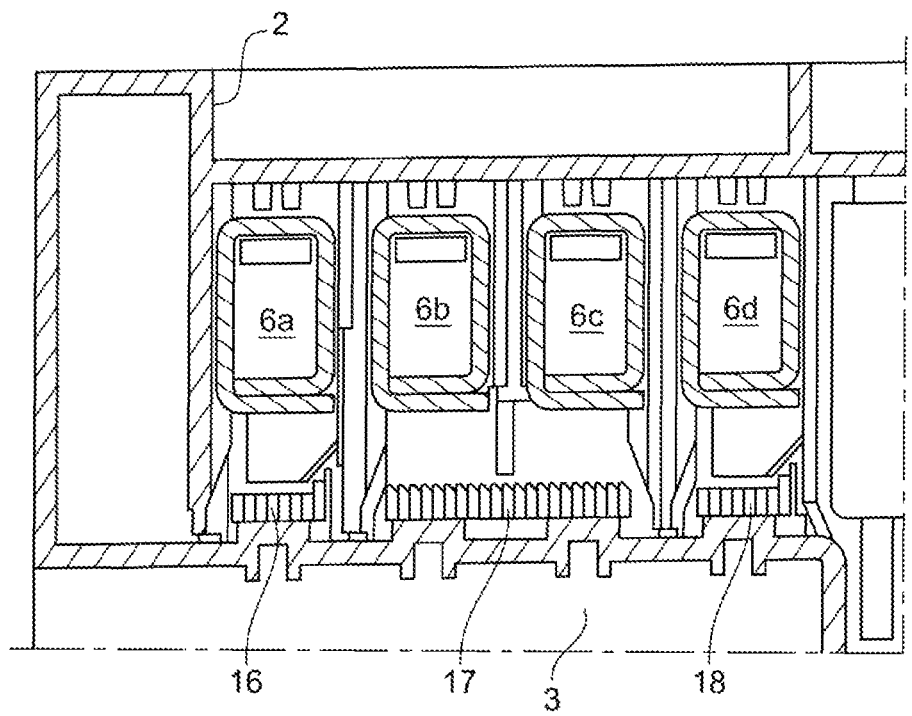
FIG. 4 is a perspective view similar to FIG. 3 with a portion of the cover of the electricity meter also being shown.

As can be seen more clearly in FIG. 3, in order to ensure proper operation of the unit 1, connection tabs made of electrically conductive material extend between the functional enclosure 5 and the terminal block 4, the tabs passing through the installation flanks 10a, 10b, 10c, and 10d. It can thus be understood that the housings 6a, 6b, 6c, and 6d cannot form hermetically closed containers between the terminal block 4 and the functional enclosure 5 because of orifices 11a, 11b, 11c, and 11d arranged through the insulating flanks 10a, 10b, 10c, and 10d in order to pass the connection tabs.

The ends of the wires press against the connection tabs and/or the insulating flanks 10a, 10b, 10c, and 10d depending on whether or not the connection tabs include respective angled lugs projecting into the housings 6a, 6b, 6c, and 6d parallel to the associated insulating flanks 10a, 10b, 10c, and 10d.

The various connection tabs are preferably made of copper.

More precisely, in this example the unit 1 has a left tab 12 associated with the first housing 6a, a right tab 14 associated with the fourth housing 6d, and a double tab 13 associated with the central housings 6b and 6c.

Consequently, the first flank 10a includes an orifice 11a arranged in its front left portion in order to pass the left tab 12. The fourth flank 10d includes an orifice 11d arranged in its front left portion in order to pass the right tab 14. The second flank 10b includes an orifice 11b arranged in its front right portion and the third flank 10c includes an orifice 11c arranged in its front left portion in order to pass the double tab 13. It should be observed that with the set of orifices there is a flank portion that is common to both of the central flanks 10b and 10c: it is the central portion 15 surrounded by the inside of the double tab 13, which is generally U-shaped.

Each insulating flank 10a, 10b, 10c, and 10d (including the central portion 15) is provided with asperities so as to limit any risk of a strand that has become detached from the stripped end of the associated wire sliding through one of the orifices 11a, 11b, 11c, or 11d that give the connection tabs access to the housings 6a, 6b, 6c, and 6d. This serves in particular to limit any risk of strands reaching sensitive zones inside the functional enclosure 5, which could give rise to a short-circuit.

More precisely, in this example, at least one face of each insulating flank 10a, 10b, 10c, and 10d facing towards the inside of the associated housing 6a, 6b, 6c, or 6d is provided with asperities, either on the face facing the angled lug of the associated connection tab or the end of the associated wire.

In the present example, only the face of each insulating flank 10a, 10b, 10c, and 10d that faces towards the inside of the insulating housing 6a, 6b, 6c, or 6d is provided with asperities. In a variant, at least one other face of the insulating flank(s) 10a, 10b, 10c, or 10d could also be provided with asperities, e.g. the face(s) of the insulating flank 10a, 10b, 10c, or 10d under consideration forming the orifice 11a, 11b, 11c, or 11d through which the associated connection tab extends.

Preferably, the non-smooth texture provided with asperities on each insulating flank 10a, 10b, 10c, and 10d is provided at least by means of serrations.

Preferably, the serrated faces of each insulating flank 10a, 10b, 10c, and 10d are shaped in such a manner that the serrations cover the entire surface in regularly distributed manner. Preferably, the serrations on any one serrated face are juxtaposed so that there are no flat zones between two consecutive serrations: a furrow of one serration is followed immediately by a ridge of another serration.

In this example, the serrations are triangular in section. Each serrated face thus presents a sawtooth section.

Furthermore, the serrations are shaped in such a manner that the free ridge of each serration forms an angle that is acute, and is thus not rounded.

This serves to facilitate strands sliding in the furrows of the serrations.

The serrations are such that the height between the free ridge of each serration and the base of the associated serration is at least 0.5 mm high, and more preferably at least 0.8 mm high, and still more preferably at least 1 mm high.

More precisely in this example, the serrations present a section in the form of a triangle that is isosceles or equilateral.

In a preferred embodiment, the serrations are shaped to extend between the cover 3 and the base 2, and also to do so substantially orthogonally to the cover 3 and to the base 2.

This limits movement of strands from right to left (or vice versa) in the housings 6a, 6b, 6c, and 6d, and thus limits any movement towards the orifices 11a, 11b, 11c, and 11d that give access to the functional enclosure.

Preferably, the non-smooth texture provided with asperities on each insulating flank 10a, 10b, 10c, and 10d is also provided in this example by roughening said flanks.

In this example, the roughening extends continuously over the entire surfaces of the textured faces of each insulating flank 10a, 10b, and 10c: the roughening is thus applied on each of the serrations on each of the insulating flanks 10a, 10b, 10c, and 10d.

As a result, the non-slip properties of the insulating flanks 10a, 10b, 10c, and 10d are increased.

By way of example, the roughening of the faces provided with serrations is such that said faces include cracks of depth lying in the range 3 to 5 hundredths of a millimeter.

The faces provided with asperities may be roughened and serrated in conventional manner, e.g. when molding the insulating flanks 10a, 10b, 10c, and 10d.

Advantageously, when the wire ends touch the non-smooth face of an insulating flank under consideration 10a, 10b, 10c, or 10d, the non-smooth texture also limits movement of the wires in the corresponding housings 6a, 6b, 6c, and 6d, and thus limits any risk of strands becoming detached or of strands sliding into the functional enclosure 5.

In a preferred embodiment, the cover 3 also includes at least one zone provided with asperities for limiting sliding of strands into the functional enclosure 5.

In the present example, the cover 3 includes a left tongue 16 associated with the first housing 6a, a central tongue 17 associated with the central housings 6b and 6c, and a right tongue 18 associated with the fourth housing 6d, each tongue 16, 17, and 18 being provided with asperities. The cover 3 is such that the tongues 16, 17, and 18 extend substantially level with the orifices 11a, 11b, 11c, and 11d that give the connection tabs access to the inside of the terminal block 4. Nevertheless, the tongues 16, 17, and 18 naturally do not impede the connection tabs being arranged in the housings 6a, 6b, 6c, and 6d.

In the present example, the tongues 16, 17, and 18 extend in line with the insulating flanks 10a, 10b, 10c, and 10d of the associated housings 6a, 6b, 6c, and 6d. More precisely, in this example, at least one face of each tongue 16, 17, and 18 that face towards the inside of the associated housing is provided with asperities.

Preferably, the non-smooth texture provided with asperities on each tongue 16, 17, and 18 is provided at least by means of serrations.

Preferably, the tongues 16, 17, and 18 are entirely corrugated, such that the serrations cover, in regularly distributed manner, the entire surfaces of their faces facing towards the inside of the housings 6a, 6b, 6c, and 6d. Preferably, the serrations on any one serrated face are juxtaposed so that there are no flat zones between two consecutive serrations: a furrow of one serration is followed immediately by a ridge of another serration.

In this example, the serrations are triangular in section. Each tongue 16, 17, and 18 thus presents a generally sawtooth section.

Furthermore, the serrations are shaped in such a manner that the free ridge of each serration forms an angle that is acute, and is thus not rounded.

This serves to facilitate strands sliding in the furrows of the serrations.

The serrations are such that the height between the free ridge of each serration and the base of the associated serration is at least 0.5 mm high, and more preferably at least 0.8 mm high, and still more preferably at least 1 mm high.

More precisely in this example, the serrations present a section in the form of a triangle that is isosceles or equilateral.

In a preferred embodiment, the serrations are shaped to extend substantially orthogonally to the base.

In reality, in this example, the serrations of the tongues 16, 17, and 18 and the serrations of the insulating flanks 10a, 10b, 10c, and 10d are identical.

By way of example, the serrations of the tongues 16, 17, and 18 are offset vertically relative to the serrations of the associated insulating flanks.

Preferably, the non-smooth texture provided with asperities on each tongue 16, 17, and 18 is also provided in this example by roughening said tongues 16, 17, and 18.

As a result, the non-slip properties of the tongues 16, 17, and 18 are increased.

In this example, the roughening extends continuously over the entire surfaces of the textured faces of the tongues 16, 17, and 18.

By way of example, the roughening of the faces provided with asperities facing towards the insides of the housings 6a, 6b, 6c, and 6d is such that said faces include cracks of depth lying in the range 3 to 5 hundredths of a millimeter.

The faces provided with asperities facing towards the insides of the housings 6a, 6b, 6c, and 6d may be roughened and serrated in conventional manner, e.g. when molding the tongues 16, 17, and 18.

Naturally, the invention is not limited to the embodiments described, and variant embodiments may be provided without going beyond the ambit of the invention as defined by the claims.

Figure 5:
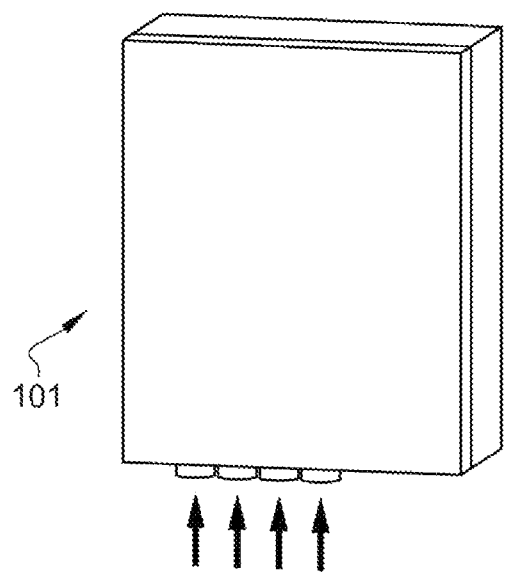
FIG. 5 is a perspective view of an electricity meter in a variant of the invention.

In particular, although above, the unit is a high-entry electricity meter, the unit could be different, and for example it could be a low-entry electricity meter as shown in FIG. 5, or more generally it could be any electronic unit or any electrical unit.

The unit could thus differ from the above description and could thus include a number of housings different from that described, e.g. only one housing.

In the same manner, the number of openings could be different from that described. For example, the unit could have only one opening.

Furthermore, although above, the openings are all provided in a single wall, the openings could be provided in different walls.

The non-smooth texture of a flank could be shaped differently from the shape described.

Thus, although above the flanks are both serrated and roughened, the flanks could be serrated only or they could be roughened only. The non-smooth texture of the flanks could be created in a manner other than by serrations or roughening, e.g. by means of a grid of ribs.

Thus, although above, the serrations extend between the cover and the base orthogonally to the cover and to the base, the serrations could have some other orientation, example they could extend parallel to the cover onto the base or they could extend diagonally between the cover and the base. The serrations could equally well extend in a plurality of directions on a single serrated face.

Although the serrations are triangular in section, the serrations could be of some other section, and for example they could be square in shape or circularly arcuate in shape. Nevertheless it is preferable to have serrations with sharp edges that make it easier for strands to drop into the bottoms of the serrations.

Surfaces of the unit other than those described could be provided with asperities in order to limit still more the dropping of any strands into the functional enclosure. Such asperities should be made on the surfaces closest to gaps between the terminal block and the remainder of the unit.

Furthermore, the non-smooth texture could apply to a single face, to a plurality of faces, or to all of the faces of the portions concerned of the unit. By way of example, there could be flanks made out of corrugated sheet so as to present serrations on both of their main faces, and/or there could be tongues having asperities on only one of their faces. Furthermore, the asperities on two faces of a single element could be different or different asperities.

The unit need not include tongues and/or need not include tongues cooperating with the insulating flanks. The unit could include some number of tongues other than that described. In general manner, the unit could include one or more zones other than those described that are likewise provided with asperities for limiting any sliding of strands into the functional enclosure. Although above, the tongues extend in line with the insulating flanks of the associated housings, at least one of the tongues it could be arranged vertically relative to the associated insulating flank.

Furthermore, although above, each tongue is offset vertically relative to the associated insulating flank, at least one of the tongues could be shaped in such a manner that the furrow of each of its serrations corresponds to a ridge of the serrations of the associated insulating flank, and vice versa. The serrations of the tongue and the serrations of the associated flank would thus be mutually offset laterally. As a result, when the cover is in place on the base, the serrations of a tongue co-operate with the serrations of the associated insulating flank in such a manner as to ensure mutual engagement between the serrations.

The invention claimed is:

1. A unit including a terminal block for receiving at least one end of a multistrand wire and comprising for this purpose at least one housing for receiving the end of the wire, the housing being provided both with a wall having an opening made therein through which the end of the wire extends in service and also with a flank arranged opposite from the wall that includes the opening, at least one face of the flank facing towards the inside of the housing being provided with asperities in order to limit any risk of a strand detached from the end of the wire sliding through a space between the flank and a remainder of the unit.

2. The unit according to claim 1, wherein asperities of the face are formed at least by serrations.

3. The unit according to claim 2, wherein the serrations are juxtaposed without space between two consecutive serrations.

4. The unit according to claim 2, wherein the serrations on a given face are all identical.

5. The unit according to claim 2, to wherein at least one of the serrations is triangular in section.

6. The unit according to claim 2, wherein at least one serration presents a sharp top.

7. The unit according to claim 2, wherein at least one of the serrations has a height of not less than 1 mm.

8. The unit according to claim 1, wherein asperities of the face are formed at least by roughening the face.

9. The unit according to claim 8, wherein the roughening is such that it forms cracks having a depth lying in the range 3 to 5 hundredths of a millimeter in the associated face.

10. The unit according to claim 1, wherein the unit includes at least one tongue arranged in the space between the flank and the remainder of the unit, at least one face of the tongue being provided with asperities.

11. The unit according to claim 10, wherein asperities of the face of the tongue are formed at least by serrations.

12. The unit according to claim 10, wherein asperities of the face of the tongue are formed at least by roughening said face.

13. The unit according to claim 1, wherein the unit is an electricity meter.

* * * * *